United States Patent
Voss et al.

(10) Patent No.: US 7,773,653 B2
(45) Date of Patent: Aug. 10, 2010

(54) DIODE LASER ARRANGEMENT AND ASSOCIATED BEAM SHAPING UNIT

(75) Inventors: Andreas Voss, Stuttgart (DE); Martin Liermann, Fillingen Schwenningen (DE); Friedhelm Dorsch, Lawrenceville, NJ (US); Klaus Wallmeroth, Zimmern (DE); Malte Kumkar, Schramberg (DE); Christian Schmitz, Dunningen (DE)

(73) Assignee: TRUMPF LASER GmbH + Co. KG, Schramberg (DE)

( * ) Notice: Subject to any disclaimer, the term of this patent is extended or adjusted under 35 U.S.C. 154(b) by 85 days.

(21) Appl. No.: 11/184,083

(22) Filed: Jul. 19, 2005

(65) Prior Publication Data

US 2006/0018356 A1     Jan. 26, 2006

(30) Foreign Application Priority Data

Jul. 19, 2004    (EP)    .................................. 04016928

(51) Int. Cl.
*H01S 5/00*     (2006.01)
(52) U.S. Cl. .................. 372/50.12; 372/50.1; 372/33; 372/36; 372/34
(58) Field of Classification Search .............. 372/50.12, 372/50.1, 33, 36, 34
See application file for complete search history.

(56) References Cited

U.S. PATENT DOCUMENTS

| | | | | |
|---|---|---|---|---|
| 4,826,269 | A * | 5/1989 | Streifer et al. | 359/19 |
| 5,513,201 | A * | 4/1996 | Yamaguchi et al. | 372/75 |
| 6,005,717 | A * | 12/1999 | Neuberger et al. | 359/619 |
| 6,151,168 | A | 11/2000 | Goering et al. | |
| 6,229,831 | B1 * | 5/2001 | Nightingale et al. | 372/36 |
| 6,259,713 | B1 * | 7/2001 | Hwu et al. | 372/36 |
| 7,339,975 | B2 * | 3/2008 | Yamanaka et al. | 372/108 |
| 2003/0063639 | A1 | 4/2003 | Yatskar et al. | |
| 2003/0099267 | A1 | 5/2003 | Hennig et al. | |

FOREIGN PATENT DOCUMENTS

| | | |
|---|---|---|
| DE | 100 61 265 | 6/2002 |
| DE | 102 29 711 | 1/2004 |
| EP | 0 902 511 | 3/1999 |
| EP | 1 059 713 | 12/2000 |
| WO | WO 02/50599 | 6/2002 |
| WO | WO 02/56074 | 7/2002 |

* cited by examiner

*Primary Examiner*—Minsun Harvey
*Assistant Examiner*—Kinam Park
(74) *Attorney, Agent, or Firm*—Fish & Richardson P.C.

(57) ABSTRACT

A diode laser apparatus includes a plurality of laser bars, each laser bar having an emission direction and a beam path. The laser bars are disposed along an arc, the emission directions of the laser bars are directed toward an inside of the arc, and a slow-axis direction of each laser bar is oriented along the arc.

16 Claims, 2 Drawing Sheets

DIODE LASER ARRANGEMENT AND ASSOCIATED BEAM SHAPING UNIT

CLAIM OF PRIORITY

This application claims priority under 35 USC §119 to European Patent Application Serial No. 04016928.6, filed on Jul. 19, 2004, the entire contents of which are hereby incorporated by reference.

TECHNICAL FIELD

This invention relates to a diode laser arrangement in which light emitted from the diode laser arrangement is coupled into an approximately rotationally-symmetric light mixer.

BACKGROUND

The pump light source for a diode-pumped high-performance solid state laser may be a diode laser arrangement that is actively cooled by microchannel heat sinks. Diode laser arrangements may include vertical diode laser stacks (vertical stacks) of laser diode bars. With a sufficiently large stack height (e.g., approximately fifty laser diode bars), these vertical stacks have approximately identical beam parameter products in a horizontal, or "slow-axis," direction and in a vertical, or "fast-axis," direction. A large number of emitting areas are uniformly distributed in each laser bar in the slow-axis ("SA") direction. The width of a bar in the SA direction is typically 10 mm. The full-angle divergence of the exiting laser radiation in the SA direction is typically approximately 6-10°. Emission in the fast-axis ("FA") direction from the individual laser bars is achieved through an aperture of a height of approximately 1 μm and has a full-angle divergence of approximately 40-70°. The laser beams emitted from each laser bar are usually collimated in the FA direction using cylindrical microlenses. Usually, each laser bar has an individual microlens. The collimated beams typically extend 0.8-1 mm in the FA direction. The full-angle divergence of the collimated beams after passing through the microlens is approximately 0.5-2° in the FA direction. The quality of the collimating lens, the accuracy of the lens' alignment, and the straightness of the laser bar determine the divergence angle.

Vertical stacking of the laser bars facilitates generation of a laser beam having a uniform beam divergence, which facilitates coupling of the combined laser beam into an inlet opening of an almost rotationally symmetric light mixer. The pump radiation from the vertical stack of laser bars is homogenized within the light mixer, for example, through multiple reflections. The radiation emitted from the light mixer is suitable for imaging a round spot on a laser crystal to pump the laser crystal. However, the limited life expectancy of the actively cooled vertical stacks, approximately 1000 hours, is disadvantageous.

German patent publication DE 100 61 265 A1 discloses quasi-passively cooled diode laser arrangements with horizontal laser diode stacks as the pump light source for high-performance solid state lasers. The stacks are two-dimensional, passive, horizontal stacks. The individual laser bars of these diode laser arrangements are not disposed on top of each other in the FA direction. Rather, the individual laser bars are next to each other in the SA direction and slightly offset in steps in the FA direction. In general, horizontal stacks are more reliable than vertical stacks because the electrical elements are separate from the cooling elements. Additionally, horizontal stacks typically have larger cooling structures and a greatly reduced number of sealing elements.

German patent publication DE 102 29 711 A1 discloses a cooling structure for horizontal laser diode stacks. The individual laser bars of these stacks are initially mounted on passive copper heat sinks. A plurality, typically four to twelve, of the heat sinks are subsequently soldered onto a common active cooler. The active cooler includes two or more thermally conducting ceramic plates. Between the plates, there are several copper layers that include milled or etched cooling channels. The layers are connected to each other as well as to the ceramic plates through the so called "direct copper bond" method. The cooling channels are wider and the cooling surface is larger compared to conventionally cooled vertical stacks, which can reduce the flow velocity of the cooling water and problems due to abrasion of the cooling channels.

The beam produced by laser diode bars disposed next to each other in the SA direction is can be disadvantageous. In contrast to a vertical stack, the asymmetry of the beam quality from the horizontal stack is further increased by the adjacent bars and the resulting widening of the overall cross-section of the emitted radiation along the SA direction. Moreover, the comparably large size of the horizontal stacks in the FA direction requires FA collimator lenses with an unusually large focal length for optically aligned stacking in the FA direction. The small divergence of the beams collimated in this manner requires very high precision of the optical components in the optical path. Additionally, the overall height of the number of stacked horizontal stacks required for a symmetrical beam quality is too large for practical applications. For this reason, beam shaping optics are required to obtain symmetry of the output radiation of horizontal stacks, which rearranges beams of a horizontal stack extending next to each other in the SA direction into beams extending on top of each other in the FA direction.

European patent publication EP 1 059 713 A2 discloses a beam shaping unit for generating a laser beam with symmetric brightness from several parallel laser beams which are emitted from the individual diodes of a laser diode bar and are laterally offset in the SA direction. In one embodiment, the beam shaping optics include a first transmissive optical element for lateral displacement of the individual laser beams in the FA direction. A second transmissive optical element deflects the laser beams in the plane formed by the SA direction and the beam directions of the individual laser beams in such a manner that the laser beams converge towards a common axis of intersection in the FA direction. The laser beams enter along the axis of intersection from different directions, and a fanned mirror is provided at the common axis of intersection. The fanned mirror includes a number of individual mirrors corresponding to the number of laser beams; the individual mirrors are rotated relative to each other and stacked on top of each other in the FA direction. The fanned mirror deflects the laser beams into a common emission direction.

SUMMARY

In one general aspect, a diode laser apparatus includes a plurality of laser bars, each laser bar having an emission direction and a beam path. The laser bars are disposed along an arc, the emission directions of the laser bars are directed toward an inside of the arc, and a slow-axis direction of each laser bar is oriented along the arc.

Implementations can include one or more of the following features. For example, at least some of the laser bars can be laterally offset relative to each other along a direction parallel to their fast-axes. The emission directions of at least some of the laser bars can be tilted relative to each other along a direction parallel to their fast-axes. The apparatus can include a first optical element (e.g., a cylindrical lens) disposed in a path of one or more laser beams emitted from one or more of the laser bars, with the first optical element being adapted to tilt the emission directions of the at least some of the laser bars.

The arc can be a circular arc, with the emission directions of the laser bars being directed toward the center of the circular arc. The apparatus can include a common cooling body and heat sinks upon which at least some of the laser bars are mounted, with the heat sinks being thermally coupled to the common cooling body. The heat sinks can be configured to define approximately identical thermal path lengths between the laser bars and the cooling body for all laser bars. At least some of the laser bars can be mounted on the combination of the heat sinks and the cooling body such that emission directions of the laser bars are tilted relative to each other.

The apparatus can include at least one optical element configured to combine laser beams of the laser bars emitted in the emission directions into one common laser beam. The apparatus can include a cylindrical jacket segment that defines the arc, with the emission directions of the laser bars being directed approximately toward the axis of the cylindrical jacket segment and with the optical element being a reflector disposed substantially at a central axis of the cylindrical jacket segment. The optical element can include individual mirrors associated with individual laser bars that are each rotated relative to each other around the axis of the cylindrical jacket segment. The individual mirrors can be tilted relative to each other in a fast-axis direction of the laser bars. The optical element can be a diffractive optical element that reflects laser beams from the laser bars.

The details of one or more implementations are set forth in the accompanying drawings and the description below. Other features will be apparent from the description and drawings, and from the claims.

DESCRIPTION OF DRAWINGS

Like reference symbols in the various drawings indicate like elements.

DETAILED DESCRIPTION

Figure 1:
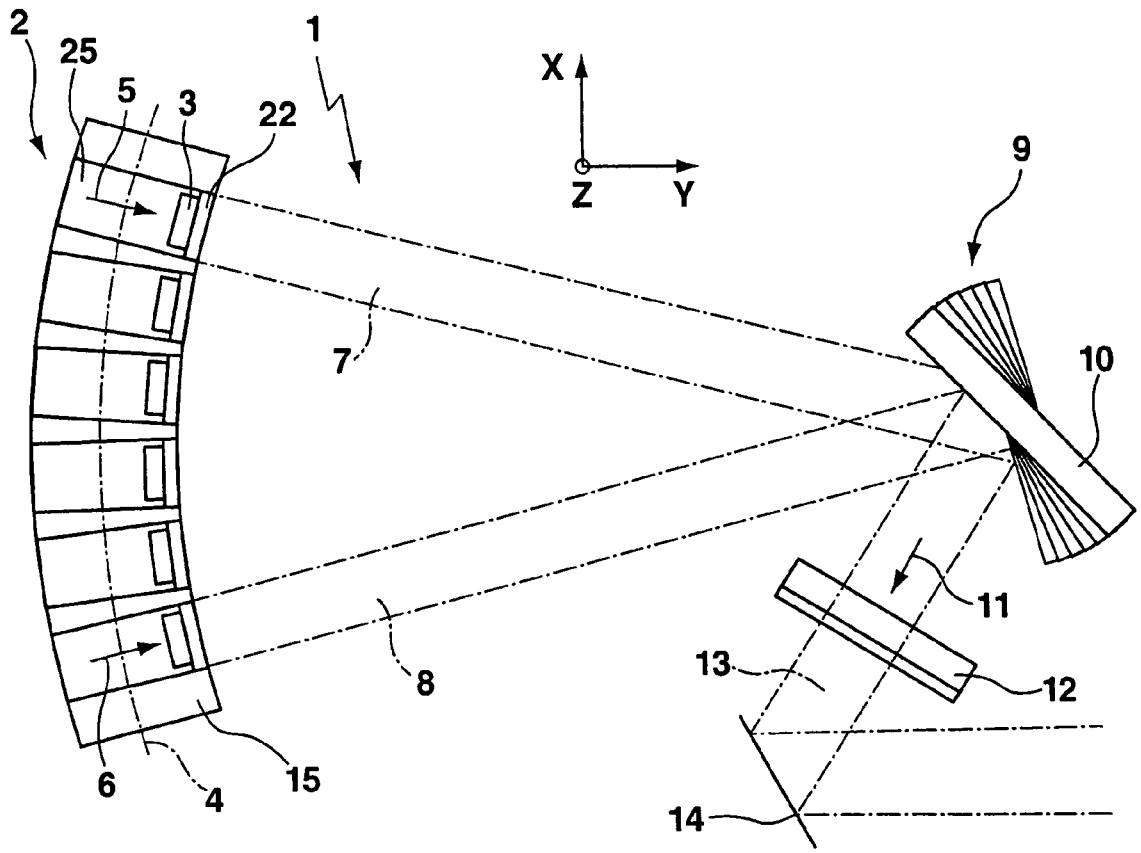
FIG. 1 is a schematic plane view of a diode laser apparatus including a beam combining unit.

The diode laser apparatus 1 shown in plane view in FIG. 1 includes a diode laser arrangement 2 that includes six laser bars 3 disposed on a circular arc 4. The circular arc 4 is disposed on an XY-plane of an XYZ-coordinate system and the laser bars 3 are laterally offset with respect to each other in the Z-direction. In this way, the laser bars 3 are arranged along a cylindrical jacket segment. The laser bars 3 are disposed on copper heat sinks 25 and a common cooling body 15. The slow-axis (SA) directions of the laser beams emitted from laser bars 3, of which an exemplary first beam 7 and an exemplary second beam 8 are shown in FIG. 1, extend into the XY-plane. The fast-axis (FA) direction extends in the Z-direction, which is perpendicular to the XY-plane. The beam outlet of each laser bar 3 includes a cylindrical lens 22 for collimating the emitted laser beams in the FA direction and optionally tilting the emitted laser beams in the FA direction. Alternatively, cylindrical lens 22 may be one cylindrical lens that extends over all of the laser bars 3 and is rotated relative to the laser bars 3 in the plane perpendicular to the laser beam propagating direction such that the direction of the beams is changed.

Each of the laser bars 3 has an emission direction, and exemplary first and second emission directions 5 and 6, which correspond to the directions of laser beams 7 and 8, respectively, are shown in FIG. 1. The emission directions 5 and 6 of the laser bars are directed approximately towards the axis of the cylindrical jacket segment along which the laser bars 3 are disposed and intersect in the XY-plane in the center of the circular arc 4. The optical path length from the laser bars 3 to the axis of the cylindrical jacket segment is the same for all laser beams emitted by laser bars 3. Reflector optics (e.g., a fanned mirror) 9 is disposed close to the center of the circular arc 4. The reflector optics 9 shown in FIG. 1 includes six individual mirrors 10 that are stacked on top of each other in the Z-direction (i.e., along the axis of the cylindrical jacket segment) and are rotated relative to each other about the Z-direction through the same angle to generate a fan-shaped arrangement. The individual mirrors 10 may be designed as plane mirrors. The surfaces of the individual mirrors are disposed at angles relative to the emission directions 5 and 6 of the laser bars 3 such that one single (common) emission direction 11 is formed through reflection. The laser beams 7 and 8, which are laterally offset with respect to each other in the Z-direction, thereby combine into one common laser beam 13. Downstream of the reflector optic 9, the individual laser beams no longer extend radially next to each other; rather they are parallel to, on top of, each other.

The common laser beam 13 may be focused along the Z-direction (FA direction) through a cylindrical lens 12, which is disposed downstream in the beam path from the reflector optics 9. Alternatively, focusing in the FA direction may be achieved with the reflector optics 9 directly, for example, by tilting the individual mirrors in the FA direction.

An optional deflecting mirror 14 ensures that the common laser beam 13 is deflected substantially in a direction parallel to the emission directions 5 and 6 of the laser bars 3. In a concavely cylindrical embodiment of the deflecting mirror 14, the common laser beam 13 may be simultaneously deflected and focused so that the cylindrical lens 12 may be omitted.

The common laser beam 13 may also be focused in the X direction (SA direction) by a cylindrical lens (not shown) in addition to cylindrical lens 12 and located downstream in the beam path or by a cylindrical mirror. Accordingly, the common laser beam 13 has a minimum height in the X- and Z-directions in a plane located in the beam path and downstream of the reflector optics 9. The inlet opening of a light mixer may be placed in this plane.

The individual mirrors 10 may be, for example, plane mirrors or concave cylindrical mirrors. The individual mirrors 10 may be rotated relative to each other through an angle relative to the axis of the cylindrical jacket segment. The angle between each of the individual mirrors 10 and the respective emission direction of the associated laser bar 3 can be selected to generate a common laser beam 13 with one single emission direction, which may result in the in the individual mirrors 10 being arranged in the shape of a fan. If individual mirrors 10 are concave cylindrical mirrors with effective focal lengths approximately equal to the distance between the laser bars 3 and the reflector optics 9, reflector optics 9 will collimate the laser beams along the SA direction. In this embodiment, it may be unnecessary to insert a collimating lens (in addition to cylindrical lens 12) downstream from reflector optics 9.

Individual mirrors 10 may be combined into one monolithic or quasi-monolithic mirror arrangement. The individual mirrors 10 may be made of, for example, diamond-milled copper or glass. The individual mirrors 10 may be coated with a highly reflective dielectric.

The reflector optics 9 may be formed by a diffractive optical element. The diffractive optical element may be produced through photolithography and may be designed in the form of, for example, a planar monolithic lattice.

Figure 2:
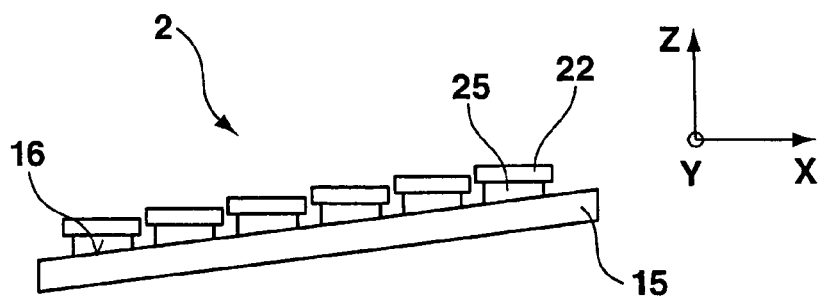
FIG. 2 is a schematic front view of the diode laser apparatus of FIG. 1.

FIG. 2 is a front view of the laser diode arrangement 2 of FIG. 1. The heat sinks 25 of the laser bars 3 are disposed on a common cooling body 15 that is positioned at an inclination relative to the XY-plane. Each laser bar may have an individual, passive heat sink 25 that is identical to the heat sinks for all of the other laser bars. Contact surfaces 16 for the heat sinks 25 may be formed on the cooling body 15, for example, through milling of a copper layer disposed on the cooling body 15. The arc-shaped arrangement and lateral offset or tilting of the laser bars in the FA direction may be achieved by the contact surfaces 16 that are disposed on the cooling body 15. For example, the arrangement in FIG. 2 shows the laser bars 3 laterally offset to each other in the Z-direction (FA direction) in a stair-step configuration. The shape of the heat sinks 25 and the contact surfaces 16 may be adapted to obtain approximately identical thermal path lengths between the individual laser bars 3 and the cooling body 15.

The diode laser apparatus 1 may include a number of diode arrangements 2 disposed on top of each other along the Z-direction, and a corresponding number of reflector optics 9. The number of reflector optics 9 is selected such that the common laser beam 13 is substantially symmetrical relative to the beam quality.

Figure 3:
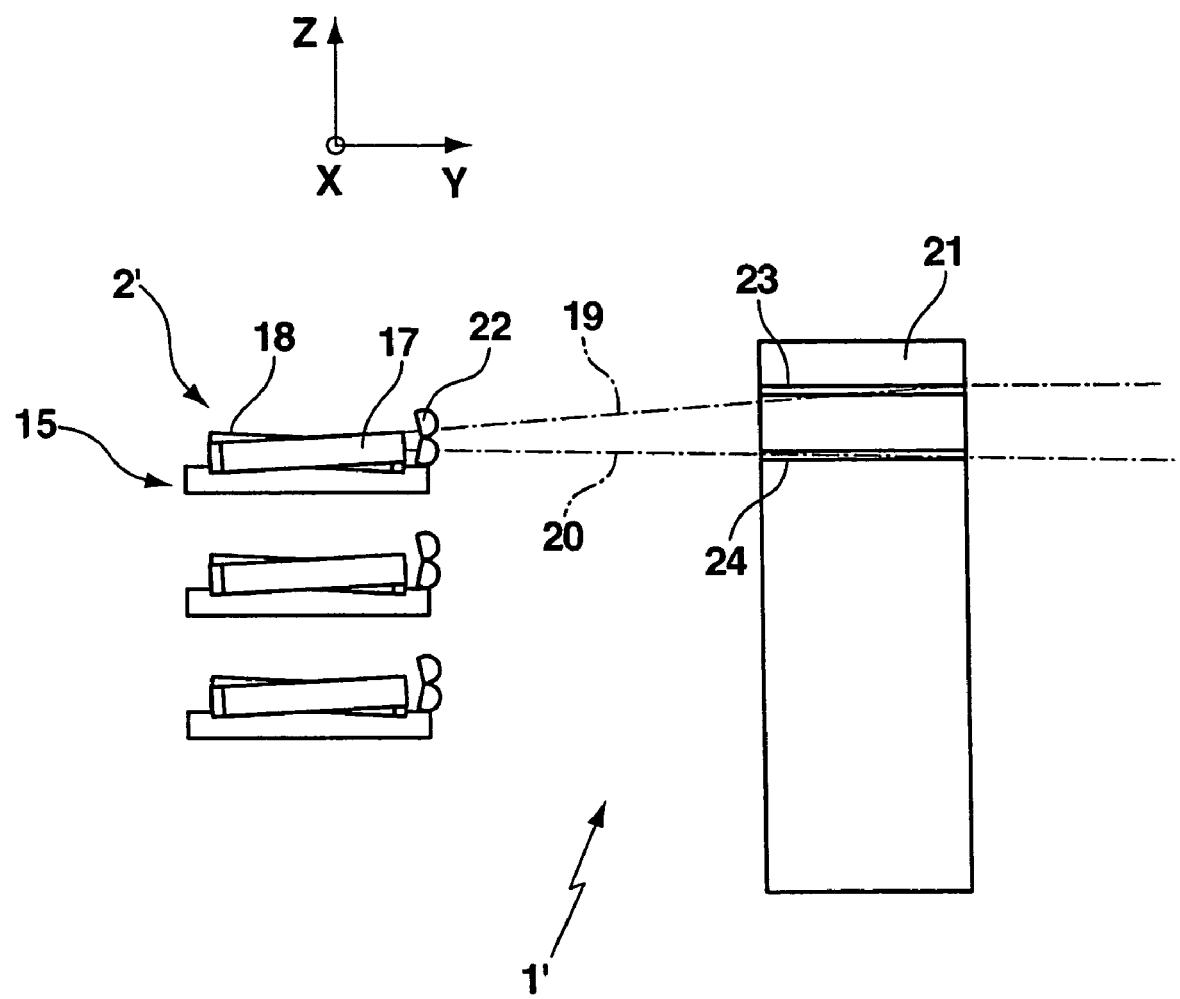
FIG. 3 is a schematic side view of an alternative diode laser apparatus.

FIG. 3 shows a side view of another diode laser apparatus 1'. In the example shown in FIG. 3, diode laser apparatus 1' includes three diode laser arrangements 2' that are laterally offset along the Z-direction. Each diode laser arrangement 2' shown in FIG. 3 includes six laser bars of which a first laser bar 17 and a second laser bar 18 are shown for each arrangement. The laser bars 17 and 18 are disposed in the XY-plane along a circular arc and are tilted relative to each other in the Z-direction such that the laser beams 19 and 20 emitted from the laser bars 17 and 18, respectively, are tilted relative to each other. Alternatively, non-tilted laser bars may be disposed along the circular arc, and the tilted laser beams 19 and 20 may be formed by microlenses 22 being tilted relative to each other in the Z-direction. The laser beams 19 and 20 strike two different individual mirrors, 23 and 24, respectively, of reflector optics 21 and are thereby deflected in the XY-plane through different angles such that they are shifted on top of each other. The reflected beams are made parallel in the FA direction (Z-direction) through slight tilting of the individual mirrors in the Z-direction (about the X axis), which is not shown.

A number of implementations have been described. Nevertheless, it will be understood that various modifications may be made. Accordingly, other implementations are within the scope of the following claims.

What is claimed is:

1. A diode laser apparatus comprising:
a plurality of laser bars, each laser bar having an emission direction, a slow axis, and a fast axis, wherein:
at least some of the laser bars are laterally offset relative to each other along a direction parallel to their fast axes,
the laser bars are disposed along an arc that is parallel with an X-Y plane,
the emission directions of the laser bars are directed toward an inside of the arc, and
the laser bars are oriented with their slow axes parallel with the X-Y plane; and
a cylindrical jacket segment that defines the arc; and
an optical element configured to combine laser beams of the laser bars into one common laser beam, wherein the optical element:
is disposed substantially at a central axis of the cylindrical jacket segment,
comprises individual mirrors associated with individual laser bars that are each rotated relative to each other around the axis of the cylindrical jacket segment, and
is configured as a fan-shaped mirror arrangement such that the laser beams are parallel to and on top of each other in the fast axis after reflecting from the optical element.

2. The apparatus of claim 1, wherein the emission directions of at least some of the laser bars are tilted relative to each other along a direction parallel to their fast axes.

3. The apparatus of claim 2, further comprising at least one first optical element disposed in a path of one or more laser beams emitted from one or more of the laser bars, wherein the first optical element is adapted to tilt the emission directions of the at least some of the laser bars.

4. The apparatus of claim 3, wherein the first optical element is a cylindrical lens.

5. The apparatus of claim 1, wherein the arc is a circular arc, with the emission directions of the laser bars being directed toward the center of the circular arc.

6. The apparatus of claim 1, further comprising:
a common cooling body; and
heat sinks upon which at least some of the laser bars are mounted, wherein the heat sinks are thermally coupled to the common cooling body.

7. The apparatus of claim 6, wherein the heat sinks are configured to define approximately identical thermal path lengths between the laser bars and the cooling body for all laser bars.

8. The apparatus of claim 6, wherein at least some of the laser bars are mounted on the combination of the heat sinks and the cooling body such that emission directions of the laser bars are tilted relative to each other.

9. The apparatus of claim 1, wherein the individual mirrors are tilted relative to each other in a fast-axis direction of the laser bars.

10. The apparatus of claim 1, wherein the optical element includes a diffractive optical element that reflects laser beams from the laser bars.

11. The apparatus of claim 2, further comprising at least one optical element configured to combine laser beams of the laser bars emitted in the emission directions into one common laser beam.

12. The apparatus of claim 11, further comprising a cylindrical jacket segment that defines the arc, wherein the emission directions of the laser bars are directed approximately toward the axis of the cylindrical jacket segment and wherein the optical element is a reflector disposed substantially at a central axis of the cylindrical jacket segment.

13. The apparatus of claim 12, wherein the optical element comprises individual mirrors associated with individual laser bars that are each rotated relative to each other around the central axis of the cylindrical jacket segment.

14. The apparatus of claim 13, wherein the individual mirrors are tilted relative to each other in a fast-axis direction of the laser bars.

15. The apparatus of claim 11, wherein the optical element is a diffractive optical element that reflects laser beams from the laser bars.

16. The apparatus of claim 1, wherein the fast axis of each of the laser bars is parallel with the fast axes of the other laser bars.

* * * * *